United States Patent
Kyoto

(10) Patent No.: US 11,264,771 B1
(45) Date of Patent: Mar. 1, 2022

(54) LASER DEVICE

(71) Applicant: Mitsubishi Electric Corporation, Tokyo (JP)

(72) Inventor: Tomohiro Kyoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/427,944

(22) PCT Filed: May 9, 2019

(86) PCT No.: PCT/JP2019/018581
§ 371 (c)(1),
(2) Date: Aug. 3, 2021

(87) PCT Pub. No.: WO2020/225908
PCT Pub. Date: Nov. 12, 2020

(51) Int. Cl.
*H01S 3/034* (2006.01)
*H01S 3/04* (2006.01)

(52) U.S. Cl.
CPC ............ *H01S 3/034* (2013.01); *H01S 3/0407* (2013.01)

(58) Field of Classification Search
CPC .............................. H01S 3/0407; H01S 3/034
USPC .......................................................... 372/92
See application file for complete search history.

(56) References Cited

U.S. PATENT DOCUMENTS

| | | | |
|---|---|---|---|
| 5,225,931 A * | 7/1993 | Stavroudis | G02B 27/0994 250/352 |
| 2009/0190225 A1 | 7/2009 | Yamada et al. | |
| 2018/0031798 A1 | 2/2018 | Choi et al. | |

FOREIGN PATENT DOCUMENTS

| | | | |
|---|---|---|---|
| JP | 59-30386 U | 2/1984 | |
| JP | 59-77584 U | 5/1984 | |
| JP | 6-2310 U | 1/1994 | |
| JP | 7-27960 A | 1/1995 | |
| JP | 10-98222 A | 4/1998 | |
| JP | 2000-156537 A | 6/2000 | |
| JP | 2003-177293 A | 6/2003 | |
| JP | 2008-250014 A | 10/2008 | |
| JP | 2009-025584 * | 2/2009 | ............... G02B 7/02 |
| JP | 2009-25584 A | 2/2009 | |
| JP | 2011-107245 * | 6/2011 | ............... G02B 7/02 |
| JP | 2011-107245 A | 6/2011 | |

(Continued)

OTHER PUBLICATIONS

International Search Report and Written Opinion dated Aug. 6, 2019, received for PCT Application PCT/JP2019/018581, Filed on May 9, 2019, 8 pages including English Translation.

(Continued)

*Primary Examiner* — Tuan N Nguyen
(74) *Attorney, Agent, or Firm* — Xsensus LLP

(57) ABSTRACT

An optical path cover is located on an optical path through which beam light travels. The optical path cover includes a cylindrical portion through which the beam light is capable of passing. A plurality of protruding portions are formed on inner walls of the cylindrical portion, the inner walls facing toward a side of an optical axis of the beam light. The protruding portions, each of which has a convex shape in cross-section taken perpendicularly to the optical axis, are arranged next to each other with the convex shape facing toward the side of the optical axis. Each of the protruding portions has an elongated shape extending along the optical axis.

6 Claims, 5 Drawing Sheets

(56) References Cited

FOREIGN PATENT DOCUMENTS

| | | |
|---|---|---|
| JP | 2018-132728 A | 8/2018 |
| WO | 2008/001662 A1 | 1/2008 |

OTHER PUBLICATIONS

Notice of Reason for Refusal dated Mar. 10, 2020, received for JP Application 2019-561333, 2020, 6 pages including English Translation.

Notice of Reason for Refusal dated Jun. 2, 2020, received for JP Application 2019-561333, 2020, 6 pages including English Translation.

Decision to Grant dated Sep. 15, 2020, received for JP Application 2019-561333, 2020, 5 pages including English Translation.

\* cited by examiner

LASER DEVICE

CROSS-REFERENCE TO RELATED APPLICATION

The present application is based on PCT filing PCT/JP2019/018581, filed May 9, 2019, the entire contents of which are incorporated herein by reference.

FIELD

The present invention relates to an optical path cover that covers the periphery of a main beam, and also relates to a laser device.

BACKGROUND

In a laser device with a resonator, light may travel off the path of a main beam moving back and forth in the resonator, and this may result in unwanted light that does not contribute to laser oscillation. Components in the laser device are irradiated with the unwanted light, which increases the temperature of the components and the temperature around the components. Because the unwanted light is emitted along with a laser beam obtained by resonance, this unwanted light degrades the beam quality of the laser device. In order to prevent the laser device from being adversely affected by the unwanted light as described above, the laser device may be provided with an optical component to remove the unwanted light around the main beam, or an optical component to prevent the unwanted light from diverging from the periphery of the main beam. As an optical component to remove the unwanted light, an aperture or an optical slit is used, through which the main beam passes while the unwanted light around the main beam is absorbed. As an optical component to prevent divergence of the unwanted light, an optical path cover is used to cover the periphery of the main beam. The optical path cover is a cylindrical structure through which the main beam can pass.

In a case where the optical component such as an aperture or an optical slit is inserted between optical elements located in the resonator, it may be difficult to ensure an adequate space to insert an aperture having an appropriate opening diameter or an optical slit having an appropriate slit width. As the spacing between the optical elements is narrower, or as the change in the beam diameter between the optical elements becomes larger, it is more difficult to insert the optical component such as an aperture or an optical slit. In a case where the optical component is downsized to overcome such a difficulty as described above, the volume of the optical component is reduced. Accordingly, the thermal capacity of the optical component is reduced, and this results in a decrease in the amount of unwanted light to be absorbed by the optical component. In a case where an optical component is added to ensure the conventional thermal capacity in order to prevent the components in the resonator from becoming faulty due to divergence of the unwanted light, the increase in the number of components results in a more complicated structure in the resonator. Further, a conventional optical path cover formed of a metal material has a problem in that the unwanted light is reflected off the inner wall of the cylindrical structure with high reflectivity, and therefore the unwanted light cannot be removed.

Patent Literature 1 discloses an optical path cover with an inner-surface structure provided on the inner wall. The inner-surface structure causes laser light incident to the inner wall to diverge. The optical path cover disclosed in Patent Literature 1 causes laser light travelling off the path of a main beam to diverge in the inner-surface structure, and absorbs the diverging laser light.

CITATION LIST

Patent Literature

Patent Literature 1: Japanese Utility Model Laid-open Publication No. S59-30386

SUMMARY

Technical Problem

In the inner-surface structure of the optical path cover in Patent Literature 1 described above, triangular-shaped, wavy-shaped, or sawtooth-shaped protruding portions are arranged next to each other in a direction parallel to the optical axis. In the optical path cover in Patent Literature 1 described above, a plurality of protruding portions are arranged next to each other in a direction parallel to the optical axis inside the cylindrical structure having the optical axis as its central axis. Therefore, machining of the cylindrical structure and formation of the protruding portions cannot be performed collectively by extrusion. Consequently, a separate step from the machining of the cylindrical structure is needed to form the protruding portions. The optical path cover in Patent Literature 1 described above has a problem in that because a separate step from the machining of the cylindrical structure is needed to form the protruding portions, machining for producing the optical path cover is difficult.

The present invention has been achieved in view of the above problems, and an object of the present invention is to provide an optical path cover that can be produced by easy machining.

Solution to Problem

An optical path cover according to an aspect of the present invention is located on an optical path through which beam light travels. The optical path cover according to the present invention includes a cylindrical portion through which the beam light is capable of passing. On an inner wall of the cylindrical portion, the inner wall facing toward a side of an optical axis of the beam light, a plurality of protruding portions are formed, each of which has a convex shape in cross-section taken perpendicularly to the optical axis, while having an elongated shape along the optical axis, the protruding portions being arranged next to each other with the convex shape facing toward the side of the optical axis.

Advantageous Effects of Invention

The optical path cover according to the present invention has an effect where it is possible for the optical path cover to be produced by easy machining.

DESCRIPTION OF EMBODIMENTS

An optical path cover and a laser device according to embodiments of the present invention will be described in detail below with reference to the drawings. The present invention is not limited to the embodiments.

First Embodiment

Figure 1:
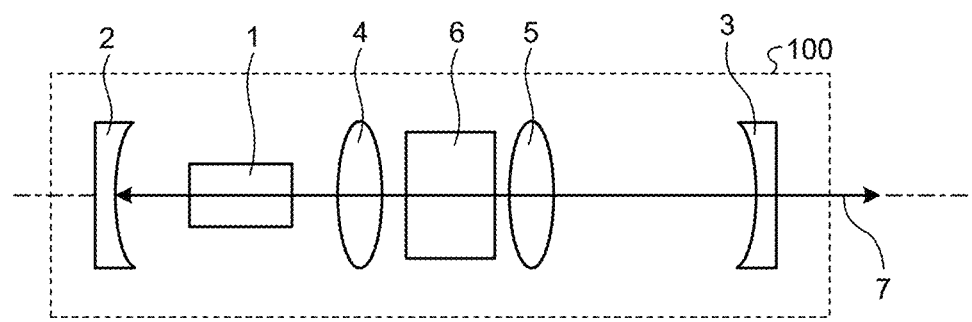
FIG. 1 is a diagram illustrating a schematic configuration of a laser device including an optical path cover according to a first embodiment of the present invention.

FIG. 1 is a diagram illustrating a schematic configuration of a laser device including an optical path cover according to a first embodiment of the present invention. A laser device 100 includes a laser medium 1, a mirror 2 and a partially reflective mirror 3, both of the mirrors 2 and 3 forming a resonator, optical elements 4 and 5 provided in the resonator, and an optical path cover 6. The optical path cover 6 is located on an optical path through which a laser beam 7 travels. The laser beam 7 is beam light.

The laser medium 1 absorbs light from an excitation source, and thereby transitions to an excited state. During the transition from the excited state to a ground state, the laser medium 1 emits the laser beam 7. The laser medium 1 also amplifies the laser beam 7 when the laser beam 7 moving back and forth between the mirror 2 and the partially reflective mirror 3 enters the laser medium 1. FIG. 1 omits illustrations of the excitation source.

The mirror 2 reflects 90% or more of the incident laser beam 7. The partially reflective mirror 3 reflects a portion of the incident laser beam 7, while allowing another portion of the incident laser beam 7 to pass through the partially reflective mirror 3. The optical elements 4 and 5 are lenses to adjust the beam diameter and the angle of divergence of the laser beam 7 traveling between the mirror 2 and the partially reflective mirror 3. It is allowable that between the mirror 2 and the partially reflective mirror 3, an optical element such as a mirror or a prism is provided other than the lenses.

The optical path cover 6 is located between the optical element 4 and the optical element 5. The optical path cover 6 covers the periphery of the laser beam 7 that is a main beam. The laser beam 7 passes through the optical path cover 6. The optical path cover 6 covers the periphery of the laser beam 7 to prevent unwanted light traveling off the optical axis of the laser beam 7 from diverging from the periphery of the laser beam 7. The optical path cover 6 also removes unwanted light by absorbing the unwanted light in an interior 12 of the optical path cover 6.

Figure 2:
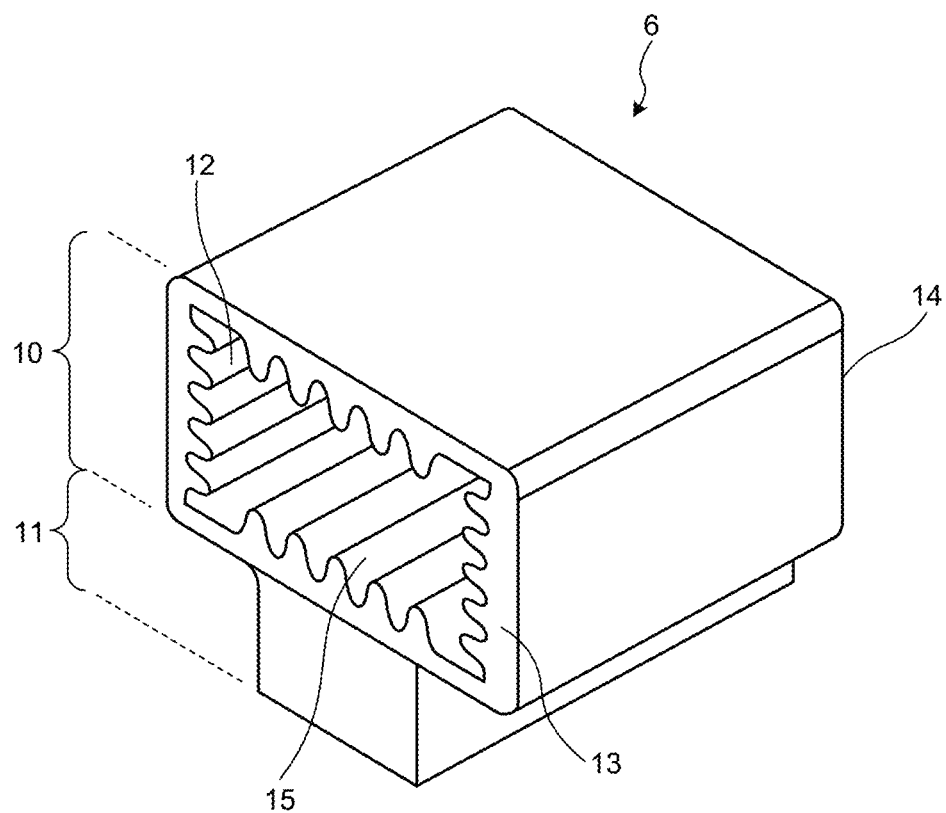
FIG. 2 is a perspective diagram of the optical path cover illustrated in FIG. 1.

FIG. 2 is a perspective diagram of the optical path cover illustrated in FIG. 1. The optical path cover 6 is a structure including a cylindrical portion 10 and a fixed portion 11. The cylindrical portion 10 is a section with a cylindrical shape through which the laser beam 7 passes. The fixed portion 11 is fixed to the installation surface. The cylindrical portion 10 has a rectangular cylindrical shape. In the interior 12 of the cylindrical portion 10, a plurality of protruding portions 15 are formed. The fixed portion 11 is fixed by screwing to the bottom surface of a housing in which constituent elements of the laser device 100 are accommodated. It is allowable that the fixed portion 11 is fixed to the bottom surface of the housing by a method other than the screwing.

The laser beam 7 incident to the interior 12 of the cylindrical portion 10 from one end face 13 of the cylindrical portion 10 travels in straight lines through the interior 12, and then is emitted to outside of the cylindrical portion 10 from the other end face 14 of the cylindrical portion 10. The laser beam 7 incident to the interior 12 of the cylindrical portion 10 from the end face 14 travels in straight lines through the interior 12, and then is emitted to outside of the cylindrical portion 10 from the end face 13.

Figure 3:
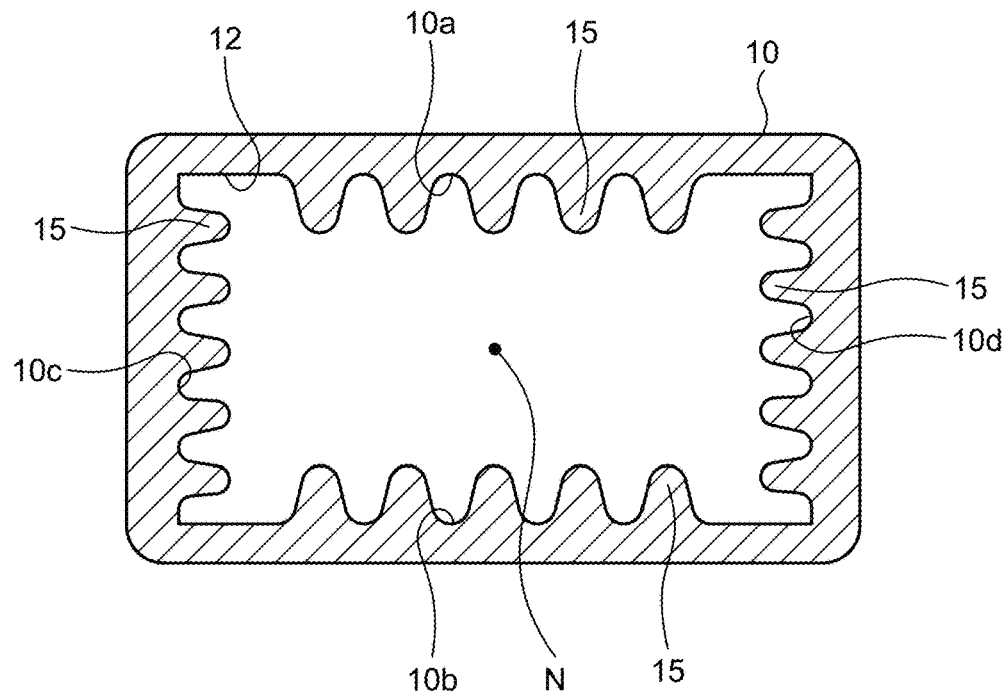
FIG. 3 is a first cross-sectional diagram of a cylindrical portion included in the optical path cover illustrated in FIG. 2.

FIG. 3 is a first cross-sectional diagram of the cylindrical portion included in the optical path cover illustrated in FIG. 2. FIG. 3 illustrates the cross-section taken perpendicularly to a central axis N of the cylindrical shape. The optical path cover 6 is positioned such that the central axis N is aligned with the optical axis of the laser beam 7 moving back and forth in the resonator.

As illustrated in FIG. 3, the outer cross-sectional shape of the cylindrical portion 10 is like a rounded corner rectangle. Inner walls 10a and 10b define part of the interior 12 of the cylindrical portion 10, and correspond to the longer sides of the rectangle. Inner walls 10c and 10d define part of the interior 12 of the cylindrical portion 10, and correspond to the shorter sides of the rectangle. In the following descriptions, the direction in which the inner walls 10a and 10b face each other is sometimes referred to as "vertical direction", while the direction in which the inner walls 10c and 10d face each other is sometimes referred to as "lateral direction".

The inner walls 10a, 10b, 10c, and 10d of the cylindrical portion 10, facing toward a side of the optical axis of the laser beam 7, are formed with the protruding portions 15. Each of the protruding portions 15 provided on the inner wall 10a has a convex shape protruding from the inner wall 10a toward the inner wall 10b. Each of the protruding portions 15 provided on the inner wall 10b has a convex shape protruding from the inner wall 10b toward the inner wall 10a. The protruding portions 15 provided on the inner wall 10a and the protruding portions 15 provided on the inner wall 10b have wavy shapes with projections and recesses in the vertical direction in cross-section taken perpendicularly to the optical axis. The wavy shape is formed of convex curves and concave curves alternately arranged next to each other.

Each of the protruding portions 15 provided on the inner wall 10c has a convex shape protruding from the inner wall 10c toward the inner wall 10d. Each of the protruding portions 15 provided on the inner wall 10d has a convex shape protruding from the inner wall 10d toward the inner wall 10c. The protruding portions 15 provided on the inner wall 10c and the protruding portions 15 provided on the inner wall 10d have wavy shapes with projections and recesses in the lateral direction in cross-section taken perpendicularly to the optical axis.

As described above, the protruding portions 15, each of which has a convex shape in cross-section taken perpendicularly to the optical axis, are arranged next to each other with their convex shapes facing toward the side of the optical axis. Further, each of the protruding portions 15 provided on the inner walls 10a, 10b, 10c, and 10d has an elongated shape parallel to the optical axis. That is, each of the protruding portions 15 has an elongated shape extending along the optical axis. Between the end face 13 and the end face 14, each of the protruding portions 15 has a constant shape in cross-section taken perpendicularly to the central axis N. It is possible to form the optical path cover 6 in its entirety on the basis of the three-dimensional shape with a constant shape in cross-section taken perpendicularly to the optical axis. Accordingly, the optical path cover 6 can be formed by extrusion. It is possible to perform machining of the cylindrical portion 10 and formation of the protruding portions 15 collectively by extrusion, so that the optical path cover 6 can be produced by easy machining at low costs.

The optical path cover 6 is made of aluminum that is one of the materials suitable for extrusion. The optical path cover 6 made of aluminum can also obtain high heat-transfer properties. The optical path cover 6 can efficiently dissipate heat generated by absorbing unwanted light to outside of the optical path cover 6. It is allowable that the optical path cover 6 is made of a material other than aluminum as long as the material can be used in extrusion.

The inner walls 10a, 10b, 10c, and 10d have undergone surface treatment in their entirety to be provided with light-absorbing properties. The inner walls 10a, 10b, 10c, and 10d have undergone alumite treatment intended to form a coating that improves laser-light absorbing properties. In addition, the inner walls 10a, 10b, 10c, and 10d may also undergo another type of surface treatment such as blasting intended to form a rough surface on the inner walls 10a, 10b, 10c, and 10d. Further, the inner walls 10a, 10b, 10c, and 10d may be given light-absorbing properties by surface treatment to apply a material with light-absorbing properties to these inner walls.

Figure 4:
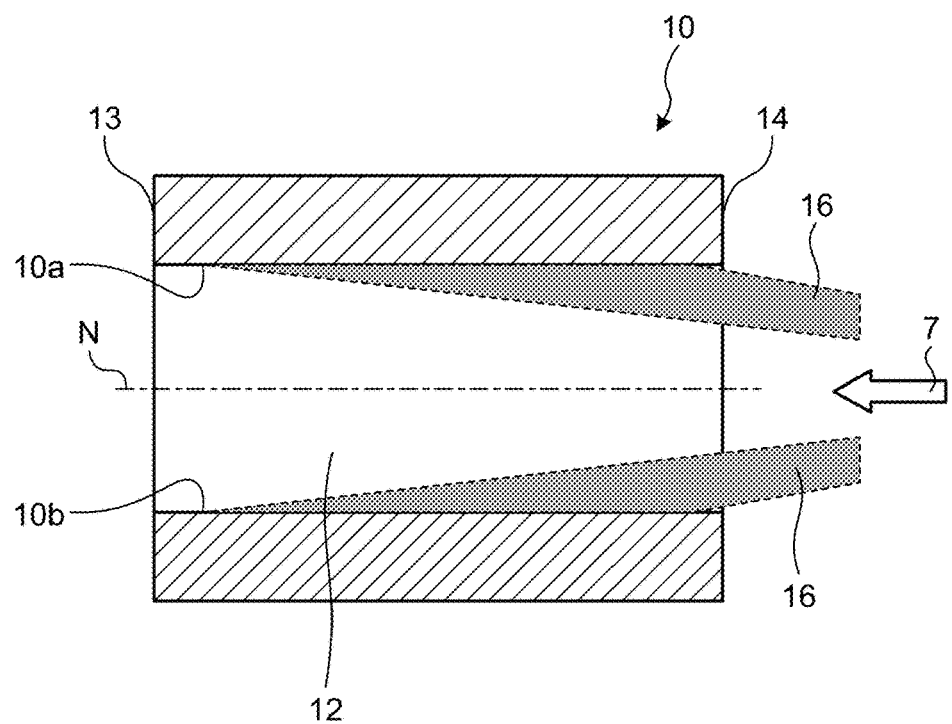
FIG. 4 is a second cross-sectional diagram of the cylindrical portion included in the optical path cover illustrated in FIG. 2.

FIG. 4 is a second cross-sectional diagram of the cylindrical portion included in the optical path cover illustrated in FIG. 2. The cross-section illustrated in FIG. 4 includes the central axis N and is parallel to the vertical direction described above. The spacing between each of the peaks of the protruding portions 15 formed on the inner wall 10a, the peaks being pointed toward the inner wall 10b, and corresponding one of the peaks of the protruding portions 15 formed on the inner wall 10b, the peaks being pointed toward the inner wall 10a, is greater than the beam width of the laser beam 7 in the vertical direction. The optical path cover 6 is positioned such that the central axis N is aligned with the optical axis of the laser beam 7, so that the laser beam 7 passes through the space between the protruding portions 15 formed on the inner wall 10a and the protruding portions 15 formed on the inner wall 10b.

The spacing between each of the peaks of the protruding portions 15 formed on the inner wall 10c, the peaks being pointed toward the inner wall 10d, and corresponding one of the peaks of the protruding portions 15 formed on the inner wall 10d, the peaks being pointed toward the inner wall 10c, is greater than the beam width of the laser beam 7 in the lateral direction. The laser beam 7 passes through the space between the protruding portions 15 formed on the inner wall 10c and the protruding portions 15 formed on the inner wall 10d.

With the above configuration, the laser beam 7 incident to the interior 12 from the end face 14 travels through the interior 12 without being blocked by the protruding portions 15, and then is emitted to outside of the cylindrical portion 10 from the end face 13. The laser beam 7 incident to the interior 12 from the end face 13 travels through the interior 12 without being blocked by the protruding portions 15, and then is emitted to outside of the cylindrical portion 10 from the end face 14.

On the other hand, in a case where unwanted light 16 traveling off the path of the laser beam 7 in the vertical direction enters the interior 12 from the end face 14, the unwanted light 16 moves toward the inner wall 10a or the inner wall 10b away from the central axis N. Because the inner walls 10a and 10b have undergone the surface treatment described above, the unwanted light 16 enters the inner wall 10a or the inner wall 10b and then is absorbed by the optical path cover 6. The inner wall 10a and the inner wall 10b are individually provided with the protruding portions 15. This increases the amount of the unwanted light 16 incident to the inner walls 10a and 10b as compared to the case where the inner walls 10a and 10b have flat surfaces. Because the amount of the unwanted light 16 incident to the inner walls 10a and 10b is increased, the amount of the unwanted light 16 to be absorbed by the optical path cover 6 is increased. When the unwanted light 16 enters the inner walls 10a and 10b, a portion of the unwanted light 16 is not absorbed into the inner wall 10a and the inner wall 10b, and diverges from the inner walls 10a and 10b. After having diverged from the inner walls 10a and 10b, the unwanted light 16 enters any of the inner walls 10a, 10b, 10c, and 10d, and is thus absorbed by the optical path cover 6. The unwanted light 16 incident to the interior 12 from the end face 13 is also absorbed by the optical path cover 6 in the same manner as the unwanted light 16 incident to the interior 12 from the end face 14.

In a case where the unwanted light 16 traveling off the path of the laser beam 7 in the lateral direction enters the interior 12 from the end face 14, the unwanted light 16 moves toward the inner wall 10c or the inner wall 10d away from the central axis N. Because the inner walls 10c and 10d have undergone the surface treatment described above, the unwanted light 16 enters the inner wall 10c or the inner wall 10d and then is absorbed by the optical path cover 6. The inner wall 10c and the inner wall 10d are individually provided with the protruding portions 15. This increases the amount of the unwanted light 16 incident to the inner walls 10c and 10d as compared to the case where the inner walls 10c and 10d have flat surfaces. As the amount of the unwanted light 16 incident to the inner walls 10c and 10d is increased, the amount of the unwanted light 16 to be absorbed by the optical path cover 6 is increased. When the unwanted light 16 enters the inner walls 10c and 10d, a portion of the unwanted light 16 is not absorbed into the inner wall 10c and the inner wall 10d, and diverges from the inner walls 10c and 10d. After having diverged from the inner walls 10c and 10d, the unwanted light 16 enters any of the inner walls 10a, 10b, 10c, and 10d, and is thus absorbed by the optical path cover 6. The unwanted light 16 incident to the interior 12 from the end face 13 is also absorbed by the optical path cover 6 in the same manner as the unwanted light 16 incident to the interior 12 from the end face 14.

With this configuration, the optical path cover 6 removes the unwanted light 16 by absorbing both the unwanted light 16 diverging in the vertical direction and the unwanted light 16 diverging in the lateral direction in the interior 12 of the cylindrical portion 10. The optical path cover 6 can prevent the unwanted light 16 from diverging from the periphery of the laser beam 7. In the laser device 100, the optical path cover 6 can prevent divergence of the unwanted light 16. Accordingly, the laser device 100 can prevent an increase in temperature of constituent components of the laser device 100 due to irradiation of the constituent components with the unwanted light 16, or can prevent an increase in temperature around the constituent components. The laser device 100 can also prevent degradation of the beam quality which is caused by emitting the unwanted light 16 along with the laser beam 7 obtained by resonance.

On the inner walls 10a, 10b, 10c, and 10d, the protruding portions 15 are spaced apart from each other with a pitch of 1 millimeter to 3 millimeters in a direction in which the protruding portions 15 are arranged next to each other. The protruding portions 15 that are spaced with a pitch of 1 millimeter to 3 millimeters can be formed by the extrusion described above. The protruding portions 15 formed inside the optical path cover 6 are not limited to being spaced with a pitch of 1 millimeter to 3 millimeters. It is allowable that the protruding portions 15 are spaced with a pitch shorter than 1 millimeter or longer than 3 millimeters as long as the protruding portions 15 can prevent the unwanted light 16 from diverging from the optical path cover 6. Each of the protruding portions 15 is formed with a constant pitch. The protruding portions 15 may include a protruding portion 15 spaced with a pitch different from the pitch of the other protruding portions 15. The protruding portions 15 may be spaced apart from each other with regularly different pitches or with irregularly different pitches.

It is allowable that the protruding portions 15 have a shape other than the wavy shape in cross-section taken perpendicularly to the optical axis. It is allowable that the protruding portions 15 have a convex shape other than the wavy shape in cross-section, such as a triangular shape, a rounded-edge triangular shape, a sawtooth shape, a rectangular shape, or a shape equivalent to a portion of a circle or an ellipse. Even in a case where the protruding portions 15 have a convex shape other than the wavy shape in cross-section, the optical path cover 6 can help absorption of the unwanted light 16 in the protruding portions 15 and thus can still prevent the unwanted light 16 from diverging from the periphery of the laser beam 7.

In the laser device 100 illustrated in FIG. 1, the optical element 4 and the optical element 5 are located in close proximity to each other. For example, the spacing between the optical element 4 and the optical element 5 is approximately 10 millimeters to 100 millimeters. The optical path cover 6 can be installed between the optical element 4 and the optical element 5 that are located in close proximity to each other.

The optical path cover 6 may be used in combination with a cooling device to cool the optical path cover 6. As the cooling device, a water-cooling device is used. The water-cooling device uses water as a refrigerant. The optical path cover 6 is cooled by the cooling device, so that the optical path cover 6 can minimize its temperature increase by efficiently dissipating heat generated by absorbing the unwanted light 16.

According to the first embodiment, the optical path cover 6 is formed with the protruding portions 15, each of which has an elongated shape extending parallel to the optical axis, while having a convex shape in cross-section taken perpendicularly to the optical axis. The optical path cover 6 includes the protruding portions 15 with such a shape as described above, so that machining of the cylindrical portion 10 and formation of the protruding portions 15 can be performed collectively by extrusion. It is possible to perform machining of the cylindrical portion 10 and formation of the protruding portions 15 collectively by extrusion, so that the optical path cover 6 can be produced by easy machining. Therefore, the optical path cover 6 achieves an effect of being produced by easy machining. The optical path cover 6 can also prevent the unwanted light 16 from diverging from the periphery of the laser beam 7. This makes it possible for the laser device 100 to reduce or prevent the temperature increase caused by irradiation with the unwanted light 16, and to reduce or prevent degradation of the beam quality caused by emission of the unwanted light 16.

Second Embodiment

Figure 5:
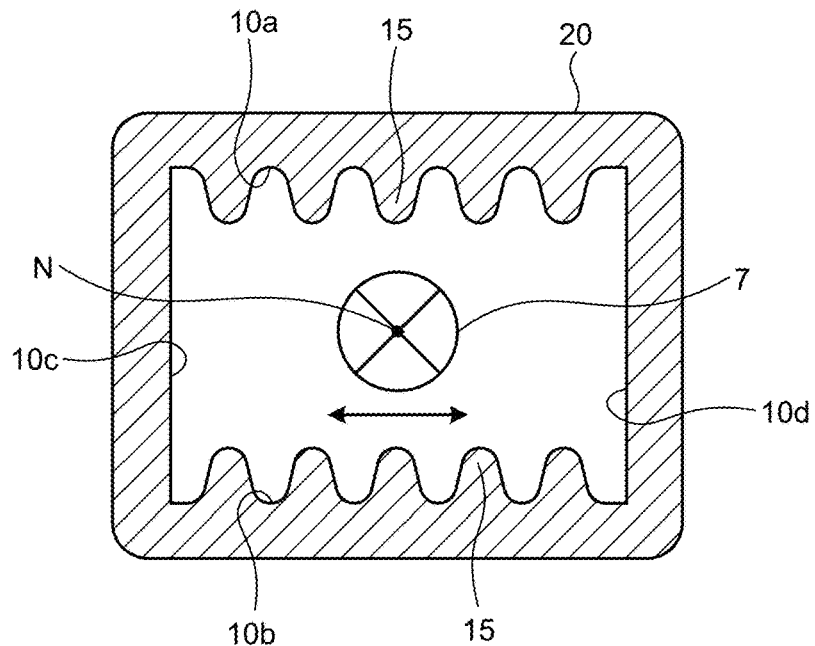
FIG. 5 is a cross-sectional diagram of a cylindrical portion included in an optical path cover according to a second embodiment of the present invention.

FIG. 5 is a cross-sectional diagram of a cylindrical portion included in an optical path cover according to a second embodiment of the present invention. In the optical path cover 6 according to the second embodiment, a plurality of protruding portions 15 are provided on the inner walls 10a and 10b of a cylindrical portion 20, while a plurality of protruding portions 15 are not provided on the inner wall 10c and the inner wall 10d of the cylindrical portion 20. In the second embodiment, constituent elements identical to those of the first embodiment described above are denoted by like reference signs and configurations different from those of the first embodiment are mainly described.

FIG. 5 illustrates the cross-section taken perpendicularly to the central axis N of the cylindrical shape. Each of the protruding portions 15 provided on the inner walls 10a and 10b protrudes in the vertical direction. As described above, the cylindrical portion 20 is formed with the protruding portions 15 protruding in one direction, that is, one of the vertical direction and the lateral direction. Each of the inner walls 10c and 10d has a flat surface.

There is a case where a larger amount of the unwanted light 16 is generated in a certain direction in cross-section taken perpendicularly to the optical axis of the laser beam 7 due to the characteristics of the laser beam 7 incident to the optical path cover 6. The optical path cover 6 is provided with the protruding portions 15 in accordance with the direction in which a larger amount of the unwanted light 16 is generated. The second embodiment describes an example where a larger amount of the unwanted light 16 is generated in the vertical direction, and accordingly the protruding portions 15 are formed on the inner walls 10a and 10b from which the protruding portions 15 protrude in the vertical direction. In the manner as described above, the optical path cover 6 is installed with the protruding portions 15 protruding in a direction aligned with the direction in which the unwanted light 16 diverges from the laser beam 7. The protruding portions 15 protrude in the direction aligned with the direction in which the unwanted light 16 diverges, so that the optical path cover 6 can prevent the unwanted light 16 from diverging from the periphery of the laser beam 7.

The protruding portions 15 are not provided on the inner wall 10c and the inner wall 10d. Accordingly, the cylindrical portion 20 has reduced outer dimensions in the lateral direction as compared to the case where the protruding portions 15 are provided on the inner walls 10c and 10d. The optical path cover 6 can downsize the cylindrical portion 20 by omitting the protruding portions 15 to be formed in a direction other than the direction in which the unwanted light 16 diverges. The inner walls 10c and 10d have undergone the surface treatment described above to be provided with light-absorbing properties. Due to this treatment, the optical path cover 6 can absorb the unwanted light 16 incident to the inner walls 10c and 10d.

In the optical path cover 6, in a case where a larger amount of the unwanted light 16 diverges in both the vertical direction and the lateral direction, or a case where the direction in which a larger amount of the unwanted light 16 diverges is not specified, it is desirable to provide the protruding portions 15 on each of the inner walls 10a, 10b, 10c, and 10d similarly to the first embodiment. With this configuration, the optical path cover 6 can prevent divergence of the unwanted light 16 in both the vertical direction and the lateral direction.

In the second embodiment, the laser beam 7 is assumed to be linearly polarized light that vibrates in a direction illustrated by the double-headed arrow in FIG. 5. The inner walls 10a and 10b are provided with the protruding portions 15. This increases the amount of p-wave component of the unwanted light 16 incident to the inner walls 10a and 10b as compared to the case where the inner walls 10a and 10b have flat surfaces. In many kinds of substances, because the s-wave component has higher reflectivity than that of the p-wave component, the p-wave component is more easily absorbed than the s-wave component. Because the amount of p-wave component of the unwanted light 16 incident to the inner walls 10a and 10b is increased, it is possible for the optical path cover 6 to absorb an increased amount of the unwanted light 16, accordingly. Therefore, the optical path cover 6 provided with the protruding portions 15 can absorb an increased amount of the unwanted light 16.

In the second embodiment, it is also possible to perform machining of the cylindrical portion 20 and formation of the protruding portions 15 collectively by extrusion, so that the optical path cover 6 can be produced by easy machining. The optical path cover 6 can also prevent the unwanted light 16 from diverging from the periphery of the laser beam 7. Further, the protruding portions 15 to be formed in a direction other than one direction are omitted, and this makes it possible to downsize the optical path cover 6.

Third Embodiment

Figure 6:
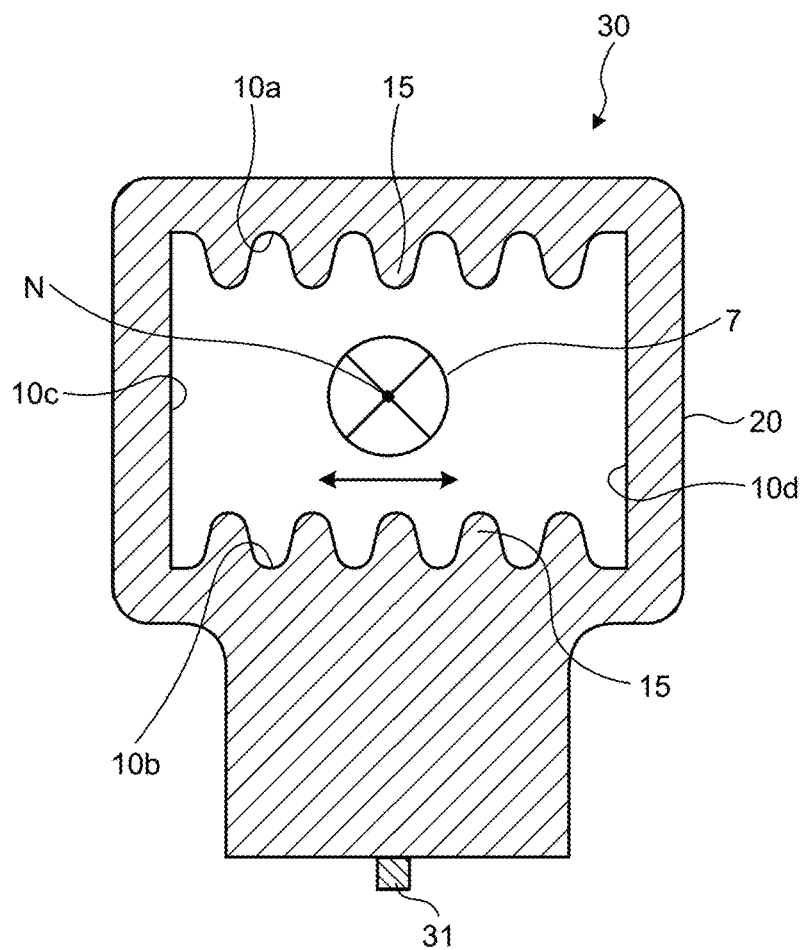
FIG. 6 is a first cross-sectional diagram of an optical path cover according to a third embodiment of the present invention.
Figure 7:
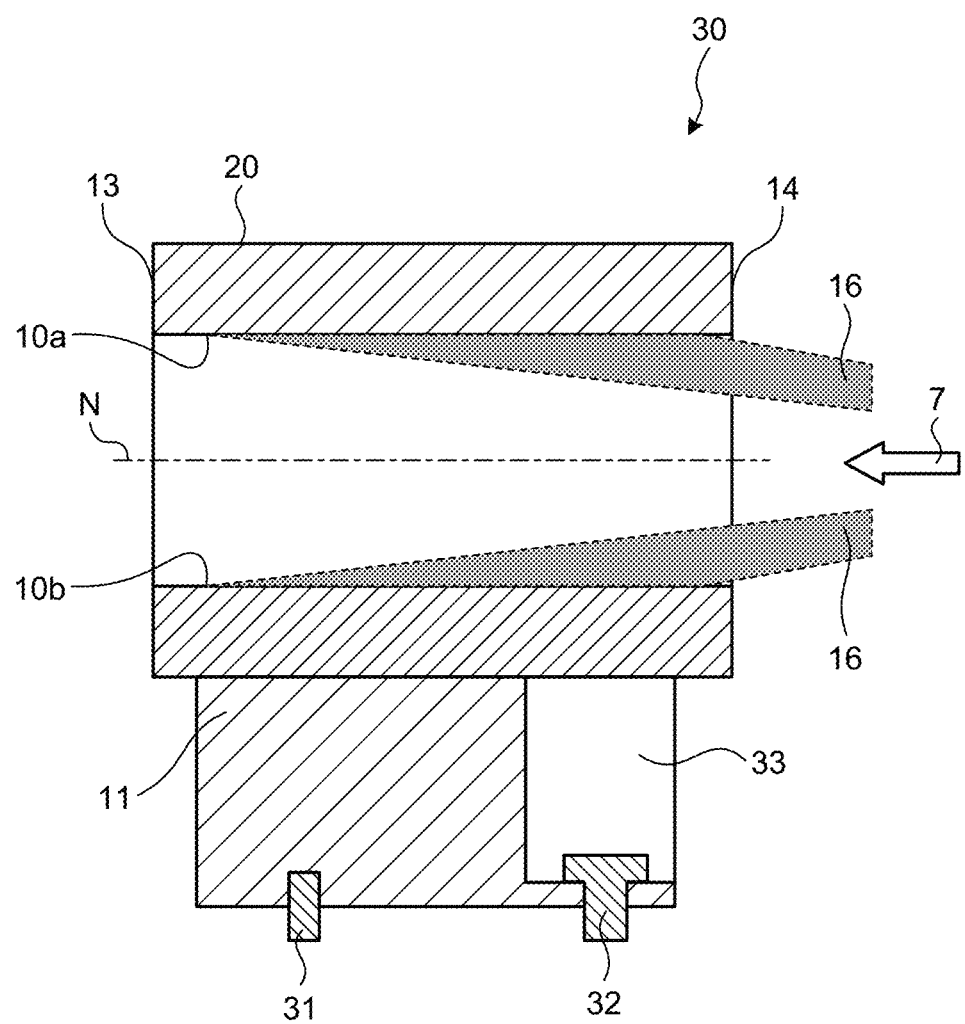
FIG. 7 is a second cross-sectional diagram of the optical path cover illustrated in FIG. 6.

FIG. 6 is a first cross-sectional diagram of an optical path cover according to a third embodiment of the present invention. FIG. 7 is a second cross-sectional diagram of the optical path cover illustrated in FIG. 6. An optical path cover 30 according to the third embodiment includes an adjustment shaft 31 about which the optical path cover 30 is rotated when the orientation of the central axis N is adjusted on the installation surface of the optical path cover 30. In the third embodiment, constituent elements identical to those of the first and second embodiments described above are denoted by like reference signs and configurations different from those of the first and second embodiments are mainly described.

FIG. 6 illustrates the cross-section taken perpendicularly to the central axis N. The cross-section illustrated in FIG. 7 includes the central axis N and is parallel to the vertical direction described above. The optical path cover 30 includes the cylindrical portion 20 identical to that according to the second embodiment. It is allowable that the optical path cover 30 includes the cylindrical portion 10 identical to that according to the first embodiment, instead of the cylindrical portion 20.

The adjustment shaft 31 is a bar-like component. A portion of the adjustment shaft 31 is embedded in the bottom portion of the fixed portion 11. The other portion of the adjustment shaft 31 protrudes from the bottom portion of the fixed portion 11. The fixed portion 11 is fixed to the installation surface with a screw 32. For example, the installation surface is the bottom surface of the housing in which the constituent elements of the laser device 100 are accommodated. The fixed portion 11 is provided with a notch 33 for the screw 32 to be located in a screw hole on the fixed portion 11.

At the time of installing the optical path cover 30 on the installation surface, a portion of the adjustment shaft 31 protruding from the fixed portion 11 is inserted into a hole formed on the installation surface prior to screwing the fixed portion 11 with the screw 32. The optical path cover 30 is positioned on the installation surface by inserting the adjustment shaft 31 into the hole formed on the installation surface, and is brought into a rotatable state about the adjustment shaft 31. The optical path cover 30 is rotated about the adjustment shaft 31 to adjust the orientation of the central axis N. After the orientation of the central axis N is adjusted, the fixed portion 11 is screwed to the installation surface with the screw 32. In this manner, installation of the optical path cover 30 is completed.

As described above, the optical path cover 30 is positioned on the installation surface by inserting the adjustment shaft 31 into the hole on the installation surface, and is brought into a state in which the orientation of the central axis N is adjustable. This makes it possible for the laser device 100 to easily position the optical path cover 30 with high precision, and to easily adjust the orientation of the central axis N with high precision.

It is possible for the optical path cover 30 to adjust the orientation of the central axis N with high precision, so that an opening of the end face 13 connecting to the interior 12, and an opening of the end face 14 connecting to the interior 12 can be located at optimal positions. In the optical path cover 30, the openings can be located at optimal positions, and thus the dimensions of the openings can be made to be small as far as possible without blocking the laser beam 7. The optical path cover 30 can reduce the dimensions of the openings, and accordingly can reduce divergence of the unwanted light 16. The optical path cover 30 can reduce the dimensions of the openings, and accordingly it is possible to downsize the cylindrical portion 20.

In the third embodiment, it is also possible to perform machining of the cylindrical portion 20 and formation of the protruding portions 15 collectively by extrusion, so that the optical path cover 30 can be produced by easy machining. Further, it is possible for the laser device 100 to easily position the optical path cover 30 with high precision, and to easily adjust the orientation of the central axis N with high precision.

Fourth Embodiment

Figure 8:
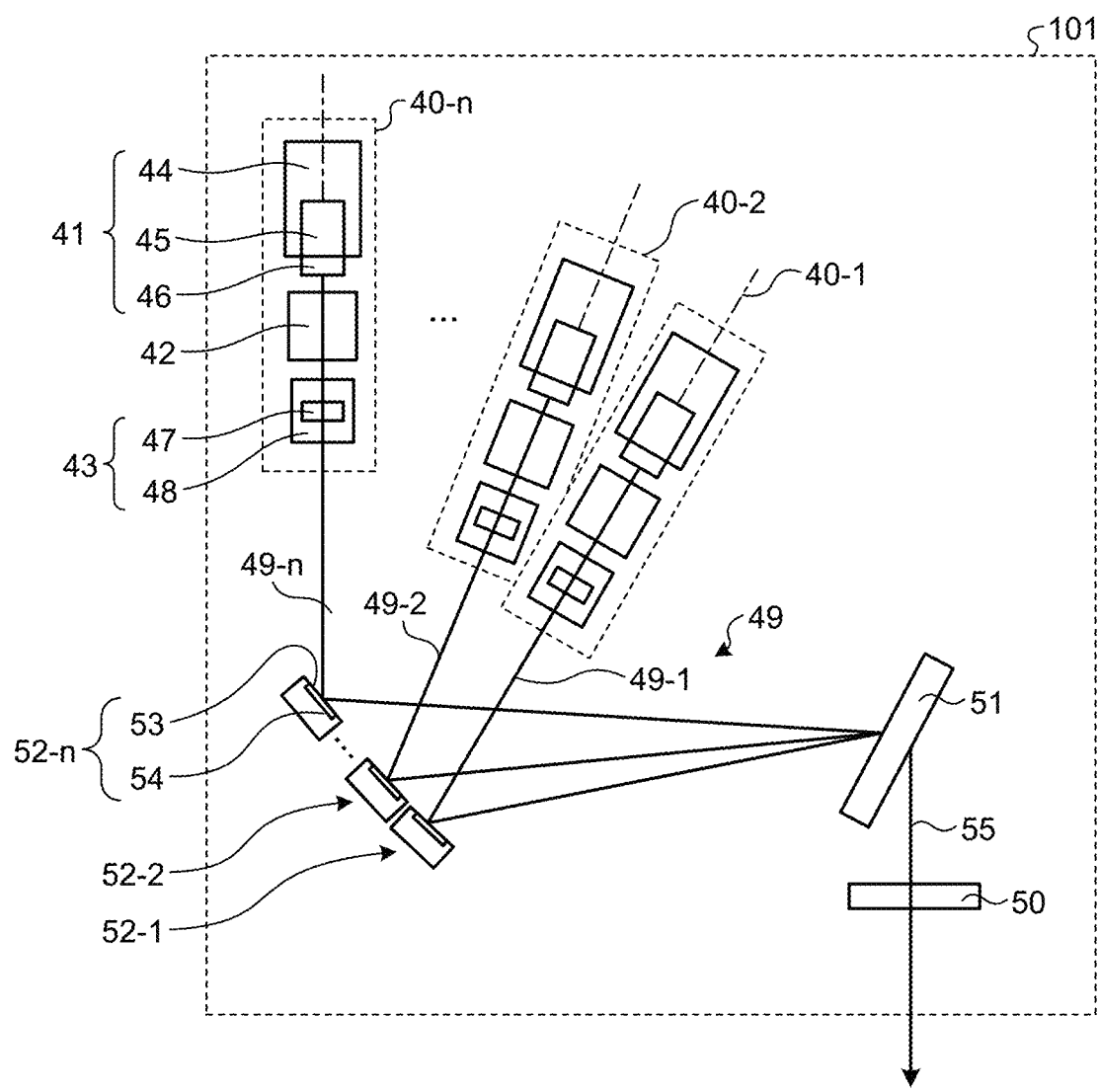
FIG. 8 is a diagram illustrating a schematic configuration of a laser device including an optical path cover according to a fourth embodiment of the present invention.

FIG. 8 is a diagram illustrating a schematic configuration of a laser device including an optical path cover according to a fourth embodiment of the present invention. A laser device 101 according to the fourth embodiment is a Direct Diode Laser (DDL). FIG. 8 illustrates constituent elements of the laser device 101 located in its housing. In the fourth embodiment, constituent elements identical to those of the first to third embodiments described above are denoted by like reference signs and configurations different from those of the first to third embodiments are mainly described.

The laser device 101 includes a plurality of Laser Diodes (LDs) 45 to emit laser beams with wavelengths different from each other, and a partially reflective mirror 50 to resonate a plurality of laser beams 49-1, 49-2, . . . , 49-$n$ emitted from the LDs 45. "n" is an integer equal to or larger than 3.

The partially reflective mirror 50 reflects a portion of incident laser beams 49 of a plurality of laser beams 49, while allowing another portion of the incident laser beams 49 to pass through the partially reflective mirror 50. The laser beams 49-1, 49-2, . . . , 49-$n$ when not distinguished from each other are referred to as "laser beam(s) 49".

A wavelength dispersive element 51 is a diffraction grating to diffract each of laser beams. The wavelength dispersive element 51 causes the laser beams 49 incident from the LDs 45 with the optical axes of the laser beams 49 oriented in different directions to travel to the partially reflective mirror 50 with these optical axes aligned with each other. In addition, the wavelength dispersive element 51 causes the laser beams 49 incident from the partially reflective mirror 50 with the optical axes of the laser beams 49 aligned with each other to travel to each of the LDs 45 with these optical axes oriented in different directions. The laser beam 49 travels in the direction of the optical axis.

The wavelength dispersive element 51 diffracts the laser beams 49 emitted from the LDs 45 to separate the laser beams of different orders from each other. The wavelength dispersive element 51 is a light-transmissive diffraction grating. The wavelength dispersive element 51 combines first-order diffracted light beams of the laser beams 49 with each other, and emits zero-order diffracted light beams toward a direction different from the direction toward the partially reflective mirror 50. It is allowable that the wavelength dispersive element 51 is a reflective diffraction grating.

The wavelength dispersive element 51 aligns the optical axes of the laser beams 49 that are the first-order diffracted light beams with each other to combine the laser beams 49 with each other. The wavelength dispersive element 51 emits a combined beam 55 toward the partially reflective mirror 50.

The combined beam 55 reflected off the partially reflective mirror 50 enters the wavelength dispersive element 51 again. The wavelength dispersive element 51 separates the combined beam 55 into the laser beams 49 with different wavelengths. The wavelength dispersive element 51 emits the separate laser beams 49 respectively toward the LDs 45. Each of the LDs 45 is provided with a mirror that reflects the laser beam 49 having returned from the wavelength dispersive element 51 to the LD 45. The mirrors in the LDs 45 and the partially reflective mirror 50 constitute the resonator that resonates the laser beams 49. The wavelength dispersive element 51 is located in the resonator.

The LD 45 is integrated with a heat sink 44 to cool the LD 45 and a lens 46. An LD package 41 is a structure in which the heat sink 44, the LD 45, and the lens 46 are integrated into one unit. The lens 46 collimates the laser beam 49 emitted from the LD 45 in a fast axis direction. The fast axis direction is defined as a direction perpendicular to the drawing of FIG. 8. The LD 45 forms an LD bar along which light-emitting points are arrayed in a slow axis direction. The slow axis direction is defined as a direction parallel to the drawing of FIG. 8.

A lens 47 collimates the laser beam 49 emitted from the LD 45 in the slow axis direction. A holder 48 holds the lens 47 and adjusts the position and orientation of the lens 47. A lens unit 43 is a structure in which the lens 47 and the holder 48 are integrated into one unit.

An optical path cover 42 is located between the lens 46 and the lens 47. The optical path cover 42 covers the periphery of the laser beam 49 that is a main beam. The optical path cover 42 is either one of the optical path covers 6 and 30 according to the first to third embodiments. Each of LD units 40-1, 40-2, . . . , 40-$n$ includes the LD package 41, the optical path cover 42, and the lens unit 43. The laser beam 49-1 is emitted from the LD 45 of the LD unit 40-1. The laser beam 49-2 is emitted from the LD 45 of the LD unit 40-2. The laser beam 49-$n$ is emitted from the LD 45 of the LD unit 40-$n$. It is allowable in each of the LD units 40-1, 40-2, . . . , 40-$n$ that an optical element that rotates the vibration direction of the laser beam 49 by 90 degrees is provided on the lens 47 closer to the optical path cover 42.

A mirror 53 reflects the laser beam 49 emitted from each of the LD units 40-1, 40-2, . . . , 40-$n$ toward the wavelength dispersive element 51. In turn, each of the mirrors 53 reflects the laser beam 49 emitted from the wavelength dispersive element 51 toward corresponding one of the LD units 40-1, 40-2, . . . , 40-$n$. A holder 54 holds the mirror 53 and adjusts the position and orientation of the mirror 53. Each of mirror units 52-1, 52-2, . . . , 52-$n$ is a structure in which the mirror 53 and the holder 54 are integrated into one unit.

A portion of the laser beam 49 emitted from the LD package 41 diverges by being reflected off the lens 46, resulting in the unwanted light 16. The laser device 101 is provided with the optical path cover 42, and can thus prevent the unwanted light 16 from diverging from the periphery of the laser beam 49. It is allowable that the optical path cover 42 can be water-cooled. Due to this water-cooled structure, the optical path cover 42 can reduce or prevent its temperature increase by efficiently dissipating heat generated by absorbing the unwanted light 16.

The lens 46 and the lens 47 are located in close proximity to each other. For example, the spacing between the lens 46 and the lens 47 is approximately 10 millimeters to 100 millimeters. It is conventionally difficult to remove the unwanted light 16 from the space between the optical elements located in close proximity to each other as described above. Even though appropriate measures can be taken such as surrounding the optical path by a thin metal plate with respect to the lens 47 on a side closer to the lens 46, there is still a problem in that when a larger amount of the unwanted light 16 enters from the LD 45, the unwanted light 16 is reflected off the metal plate and then diverges, causing partial heat generation. Because the spacing between the LD units 40-1, 40-2, . . . , 40-$n$ is narrow, installation of such a metal plate leads to a problem of more complicated layout of the constituent elements of the laser device 101. Further, in a case with a high level of beam intensity, when a plate-like component such as an aperture, an optical slit, and the thin metal plate described above is installed between the optical elements located with a narrow spacing, then thermal breakage may occur in the plate-like component because the plate-like component does not have a sufficient heat capacity.

The optical path cover 42 according to the fourth embodiment can be installed between the lens 46 and the lens 47 located in close proximity to each other. This makes it possible for the laser device 101 to reduce or prevent partial heat generation when a larger amount of the unwanted light 16 enters from the LD 45, and to make the layout of the constituent elements less complicated. The optical path cover 42 has a block-like shape, and thus has a greater heat capacity and a higher heat resistance as compared to the plate-like component described above. Therefore, even when the optical path cover 42 is installed between the lens 46 and the lens 47, the laser device 101 can still reduce or prevent thermal breakage of the optical path cover 42.

According to the fourth embodiment, the laser device 101 is provided with the optical path cover 42, and can thus prevent the unwanted light 16 from diverging from the periphery of the laser beam 49. According to the fourth embodiment, a DDL can be achieved in which it is possible to reduce or prevent the temperature increase caused by irradiation with the unwanted light 16, and to reduce or prevent degradation of the beam quality caused by emission of the unwanted light 16.

The configurations described in the above embodiments are only examples of the content of the present invention. The configurations can be combined with other well-known techniques, and part of each of the configurations can be omitted or modified without departing from the scope of the present invention.

REFERENCE SIGNS LIST

1 laser medium; 2, 53 mirror; 3, 50 partially reflective mirror; 4, 5 optical element; 6, 30, 42 optical path cover; **7, 49, 49-1, 49-2, 49-*n* laser beam; 10, cylindrical portion; 10***a*, 10*b*, 10*c*, 10*d* inner wall; 11 fixed portion; 12 interior; 13, 14 end face; 15 protruding portion; 16 unwanted light; 31 adjustment shaft; 32 screw; 33 notch; **40-1, 40-2, 40-*n* LD unit; 41 LD package; 43 lens unit; 44 heat sink; 45 LD; 46, 47 lens; 48, 54 holder; 51 wavelength dispersive element; 52-1, 52-2, 52-*n* mirror unit; 55 combined beam; 100, 101** laser device; N central axis.

The invention claimed is:

1. An laser device comprising an optical path cover to be located on an optical path through which beam light travels, wherein
the optical path cover includes a cylindrical portion through which the beam light is capable of passing, the cylindrical portion having a rectangular cylindrical shape, wherein
on an inner wall of the cylindrical portion, the inner wall facing toward a side of an optical axis of the beam light, a plurality of protruding portions are formed, each of which has a convex shape in cross-section taken perpendicularly to the optical axis, while having an elongated shape along the optical axis, the protruding portions being arranged next to each other with the convex shape facing toward the side of the optical axis,
the protruding portions are provided on each of inner walls facing each other in a certain direction in which a larger amount of unwanted light generated due to characteristics of the beam light diverges as compared to other directions, the certain direction being one direction perpendicular to the optical axis, the protruding portions protruding in the one direction, and
each of inner walls facing each other in a direction perpendicular to the optical axis and perpendicular to the one direction has a flat surface.

2. The laser device according to claim 1, wherein the inner wall has undergone surface treatment to be provided with light-absorbing properties.

3. The laser device according to claim 1, comprising an adjustment shaft about which the optical path cover is rotated when an orientation of a central axis of the cylindrical portion is adjusted, on an installation surface of the optical path cover, the installation surface being a bottom surface of a housing of the laser device.

4. The laser device according to claim 3, wherein the adjustment shaft is positioned on the installation surface by being inserted into a hole formed on the installation surface.

5. The laser device according to claim 1, comprising:
a plurality of laser diodes to emit the laser beams with wavelengths different from each other, the laser beams each being the beam light;
a mirror to resonate a plurality of the laser beams with wavelengths different from each other with each of the laser diodes; and
a wavelength dispersive element to cause the laser beams incident from the laser diodes with the optical axes oriented in different directions, to travel to the mirror with the optical axes aligned with each other, wherein
the optical path cover is located on an optical path between the wavelength dispersive element and each of the laser diodes.

6. The laser device according to claim 1, wherein
the beam light is linearly polarized light, and
the protruding portions are provided while protruding in a direction in which a p-wave component of unwanted light generated due to characteristics of the beam light diverges.

* * * * *